(12) United States Patent
Lee et al.

(10) Patent No.: US 9,064,817 B2
(45) Date of Patent: Jun. 23, 2015

(54) STRUCTURE OF WAFER LEVEL CHIP MOLDED PACKAGE

(71) Applicant: TAIWAN SEMICONDUCTOR MANUFACTURING COMPANY, LTD., Hsinchu (TW)

(72) Inventors: Hsin-Hui Lee, Kaohsiung (TW); William Cheng, Hsinchu (TW)

(73) Assignee: TAIWAN SEMICONDUCTOR MANUFACTURING COMPANY, LTD. (TW)

( * ) Notice: Subject to any disclaimer, the term of this patent is extended or adjusted under 35 U.S.C. 154(b) by 0 days.

(21) Appl. No.: 14/149,936

(22) Filed: Jan. 8, 2014

(65) Prior Publication Data

US 2014/0117568 A1 May 1, 2014

Related U.S. Application Data

(62) Division of application No. 12/820,587, filed on Jun. 22, 2010, now Pat. No. 8,647,963.

(60) Provisional application No. 61/223,915, filed on Jul. 8, 2009.

(51) Int. Cl.
| | |
|---|---|
| *H01L 23/544* | (2006.01) |
| *H01L 23/02* | (2006.01) |
| *H01L 21/00* | (2006.01) |
| *H01L 23/31* | (2006.01) |
| *H01L 21/56* | (2006.01) |

(Continued)

(52) U.S. Cl.
CPC .......... *H01L 23/3114* (2013.01); *H01L 21/561* (2013.01); *H01L 21/563* (2013.01); *H01L 23/3121* (2013.01); *H01L 25/50* (2013.01); H01L 2224/73204 (2013.01); H01L 2225/06513 (2013.01); *H01L 24/94* (2013.01); *H01L 24/97* (2013.01); H01L 2224/16145 (2013.01); H01L 2224/32145 (2013.01); H01L 2224/94 (2013.01); H01L 2224/97 (2013.01)

(58) Field of Classification Search
USPC ............ 257/620, E21.502, E23.179; 438/113
See application file for complete search history.

(56) References Cited

U.S. PATENT DOCUMENTS

| | | | |
|---|---|---|---|
| 6,399,463 B1 | 6/2002 | Glenn et al. | |
| 2002/0081771 A1* | 6/2002 | Ding et al. | 438/108 |
| 2003/0100143 A1* | 5/2003 | Mulligan et al. | 438/113 |

(Continued)

FOREIGN PATENT DOCUMENTS

CN 101188221 5/2008

OTHER PUBLICATIONS

Chinese Application No. 2012060100785510 corresponding to U.S. Appl. No. 12/820,587.

(Continued)

*Primary Examiner* — Khaja Ahmad
(74) *Attorney, Agent, or Firm* — Lowe Hauptman & Ham, LLP (57) ABSTRACT

An integrated circuit structure includes a semiconductor chip having a die side and a non-die side, the die side having one or more trenches formed therein. The integrated circuit structure further includes at least one die bonded onto the die side of the semiconductor chip. The integrated circuit structure further includes a protecting material encapsulating the at least one die and substantially filling the one or more trenches.

20 Claims, 6 Drawing Sheets

(51) Int. Cl.
*H01L 25/00* (2006.01)
*H01L 23/00* (2006.01)

(56) References Cited

U.S. PATENT DOCUMENTS

2003/0216009 A1* 11/2003 Matsuura et al. ............. 438/460
2004/0113283 A1*  6/2004 Farnworth et al. ............ 257/782
2004/0121563 A1   6/2004 Farnworth et al.
2004/0212047 A1* 10/2004 Joshi et al. ................... 257/620
2006/0103025 A1*  5/2006 Furusawa et al. ............. 257/758
2007/0099341 A1   5/2007 Lo
2007/0132104 A1   6/2007 Farnworth et al.
2008/0277765 A1  11/2008 Lane et al.
2008/0277806 A1* 11/2008 Chen et al. .................... 257/797

OTHER PUBLICATIONS

Office Action dated Mar. 19, 2015 from corresponding No. TW 099122431.

* cited by examiner

STRUCTURE OF WAFER LEVEL CHIP MOLDED PACKAGE

CROSS-REFERENCE TO RELATED APPLICATIONS

The present application is a divisional of U.S. application Ser. No. 12/820,587, filed Jun. 22, 2010, which claims priority of U.S. Provisional Application No. 61/223,915 filed Jul. 8, 2009, both of which are incorporated herein by reference in their entireties.

TECHNICAL FIELD

The present disclosure relates generally to the fabrication of semiconductor devices, and more particularly, to a structure and method of wafer level chip molded packaging.

BACKGROUND

In the semiconductor industry, efforts to reduce the thickness of a semiconductor wafer are in progress to respond to the goals of reducing the thickness of semiconductor packages, increase the chip speed, and for high-density fabrication. In stacked wafer fabrication, two or more semiconductor wafers having integrated circuits formed therein are joined together. Thickness reduction is performed by so-called backside grinding of a semiconductor wafer on the surface opposite that containing pattern-formed circuitry. Because the thinned wafer tends to have insufficient strength and is more susceptible to deformation such as bending and/or warping, an encapsulating step is typically performed in which a surface of the wafer is encapsulated in a molding compound (e.g., thermocuring epoxy resin), prior to the wafer being separated into individual chip packages using a dicing process. These individual chip packages are then mounted onto a substrate, such as a printed circuit board (PCB).

Conventional stacked wafer processes, however do not come without their drawbacks. At times, where the wafer is subject to temperature cycle tests, for example the molding compound may become undone or delaminate from the wafer to which it is attached. Molding delamination is detrimental to the fabrication process and tend to decrease the overall process yield and may degrade the quality and reliability of the chip packages that are produced. Moreover, where molding delamination from the wafer has occurred, the edges of chips of the wafer may be more susceptible to cracking, chipping, and/or corrosive environmental influences during the subsequent dicing process and associated handling. For these reasons and other reasons that will become apparent upon reading the following detailed description, there is a need for an improved method of wafer level chip fabrication that avoids the shortcomings of the conventional wafer bonding processes.

BRIEF DESCRIPTION OF THE DRAWINGS

The features, aspects, and advantages of the present disclosure will become more fully apparent from the following detailed description, appended claims, and accompanying drawings in which:

DETAILED DESCRIPTION

In the following description, numerous specific details are set forth to provide a thorough understanding of the present disclosure. However, one having an ordinary skill in the art will recognize that the disclosure can be practiced without these specific details. In some instances, well-known structures and processes have not been described in detail to avoid unnecessarily obscuring the present disclosure.

Reference throughout this specification to "one embodiment" or "an embodiment" means that a particular feature, structure, or characteristic described in connection with the embodiment is included in at least one embodiment of the present disclosure. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments. It should be appreciated that the following figures are not drawn to scale; rather, these figures are merely intended for illustration.

Figure 1:
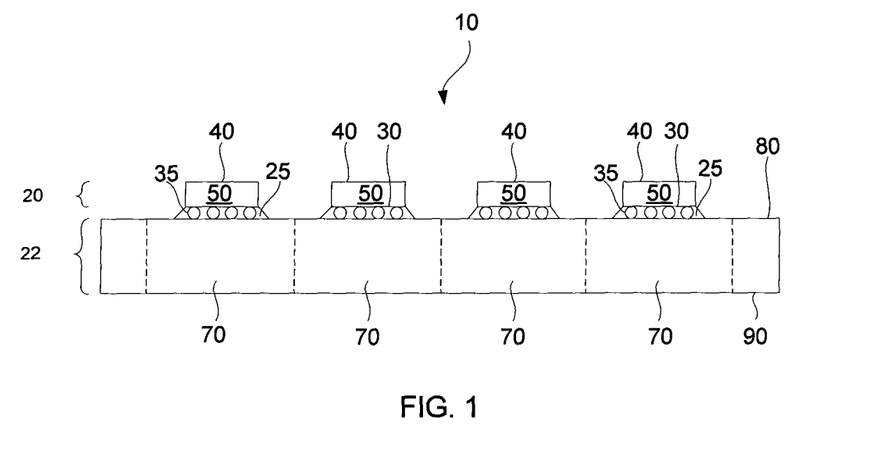
FIGS. 1-10 are cross-sectional views of one embodiment of an integrated circuit structure during various fabrication stages thereof.

FIG. 1 is a cross-sectional view of one embodiment of an integrated circuit structure 10 during a fabrication stage thereof. Dies 20 are bonded onto wafer 22. Dies 20 may include memory chips, RF (radio frequency) chips, logic chips, or other chips. Dies 20 each has a front surface 30 and a back surface 40. Each of the dies 20 includes semiconductor substrate 50, wherein the back surfaces 40 of dies 20 are also the back surfaces of the respective semiconductor substrates 50.

Wafer 22 includes a plurality of semiconductor chips 70. Wafer 22 includes semiconductor wafers such as silicon, gallium arsenide, a rock crystal wafer, sapphire, glass, and the like. Chips 70 may include memory chips, RF (radio frequency) chips, logic chips, or other chips. In an embodiment of the present disclosure, each of the dies 20 is bonded onto one of the semiconductor chips 70. Alternatively, one semiconductor chip 70 may have more than one die 20 bonded thereon. In some embodiments, dies 20 and chips 70 are bonded face-to-face, wherein the bonding methods include commonly used methods such as oxide-to-oxide bonding, oxide-to-silicon bonding, copper-to-copper bonding, adhesive bonding, and the like. In one embodiment, each of the dies 20 is bonded to one of the plurality of chips by solder bumps 35. In some embodiments, an underfill material 25 may be used to fill in the gap between one of the plurality of dies 20 and one of the plurality of chips 70, the underfill material substantially encapsulating the solder bumps 35. The dies 20 bonded onto a same semiconductor chip 70 may each have the same or different circuit design or sizes.

Wafer 22 has a front surface 80 and a back surface 90, wherein bond pads (not shown) and/or other interconnect structures (not shown) are close to the front surface 80, while the back surface 90 is the back surface of a semiconductor substrate. Integrated circuits (not shown) including active and passive devices such as transistors, resistors, capacitors, and the like, are formed at the front surface 80 of wafer 22. In one embodiment of the present disclosure, semiconductor chip 70 includes one or more through-silicon via (TSV) (not shown) that extend from the front surface 80 down into wafer 22, wherein the TSV are connected to one or more of the dies 20.

Figure 2:
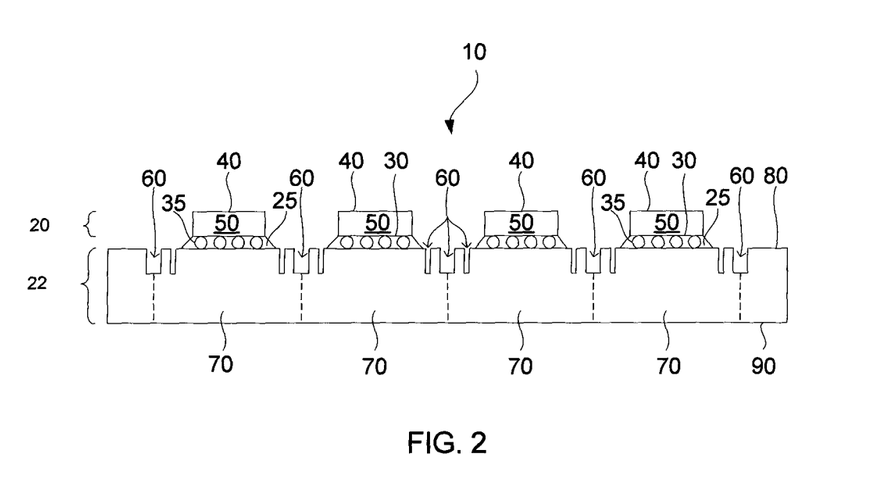

With reference now to FIG. 2, one or more grooves or trenches 60 are formed on the front surface 80 of the wafer 22. Trench 60 may be formed by a conventional laser scribing technique or other suitable cutting methods where a high energy beam, such as a laser beam, for example is used to penetrate or cut out a portion of the front surface 80 of wafer 22. The trench 60 represents a volume that is defined by the width of the bottom of the trench times the height of the sidewall times the length of the trench made in the front surface 80 of wafer 22. The volume of the trench 60 represents an amount of silicon that is removed from the wafer surface by a laser scribing machine or other suitable cutting tools.

Suitable laser equipment to be used in a scribing process can be any of those commercially available lasers. For instance, a continuous Nd/YAG laser having a power level between 1 and 2 watts can be suitably used. One skilled in the art understands that the power of the laser can be suitably adjusted such that only a desirable depth, width, and/or length of the silicon layer is removed. One of ordinary skill in the art understands also that the depth should be deep enough to allow a later-to-be deposited molding compound to be formed in the trenches 60 to enable sufficient adhesion or anchorage to the underlying wafer 22 so that during a temperature cycle test or dicing step, for example the molding compound will not be undone or delaminate from the wafer. At the same token, the depth should not be so deep where stress is built up in the silicon layer due to the trench 60 formation. In one embodiment of the present disclosure, the trench 60 is formed to a depth of between about 100 Angstroms to about 150,000 Angstroms. In another embodiment, the trench 60 is formed to a depth of between about 1,000 Angstroms to about 50,000 Angstroms.

Figure 3:
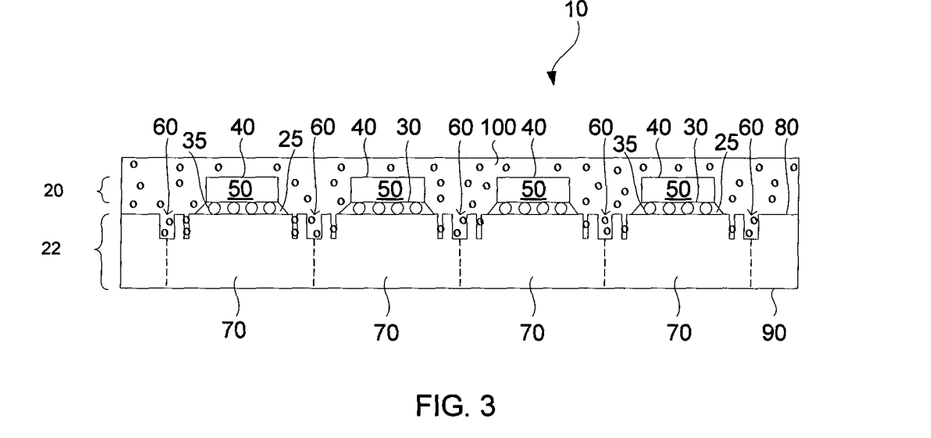

As shown in FIG. 2, one or more of the trenches 60 are formed on the front surface 80 of wafer 22 between any two of the plurality of dies 20. With reference now to FIG. 3, a molding compound or protecting material 100 is coated over the front surface 80 of wafer 22, over the plurality of dies 20, and substantially in the trenches 60. Protecting material 100 is formed of a curable material such as, for example a polymer-based material, resin-based material, polyimide, silicon oxide, epoxy, benzocyclobutenes (BCB), SILK™ (Dow Chemical), or a combination thereof. In order to prevent wafer 22 or a body to be ground from warping during a grinding process, for example the protecting material 100 preferably has a sufficiently high stiffness and flexural rigidity following curing of the protecting material 100. Protecting material 100 may be formed on wafer 22 to a thickness greater than the height of dies 20 so as to encapsulate dies 20. The thickness of protecting material 100 is not particularly limited so long as it can ensure the thickness uniformity required for a later process, such as the grinding of wafer 22 or a body to be ground. However, to obtain the desired thickness uniformity after grinding of the substrate, the thickness of protecting material 100 is preferably uniform.

Protecting material 100 may be applied to integrated circuit structure 10 using processes such as, for example injection molding, compression molding, stencil printing, spin-on coating, or future-developed molding processes. After the coating of protecting material 100 and prior to a later wafer thinning or dicing process, a curing or baking step is performed to solidify protecting material 100. In one embodiment of the present disclosure, the protecting material 100 is baked in a heating chamber at a temperature of from about 100° C. to about 200° C. for a time of from about 30 minutes to about 8 hours. After the protecting material 100 is cured, the non-chip side of wafer 22 may undergo a further thinning process to grind the non-chip side to reduce the thickness of the wafer.

Figure 5:
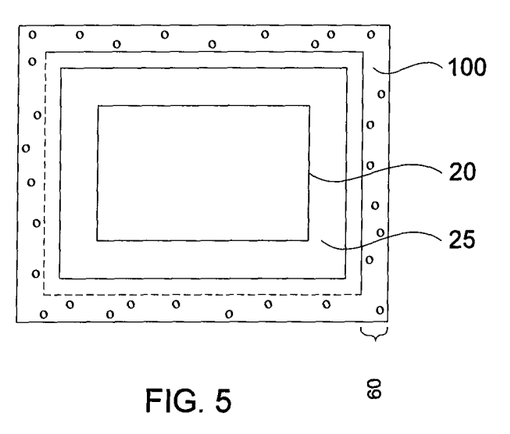
Figure 6:
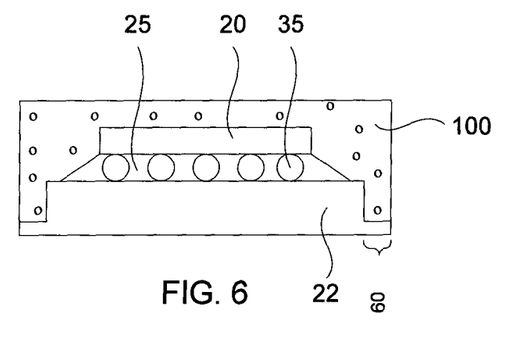

Going back to the discussion on trench 60 formation, FIG. 6 shows a cross-sectional view of the integrated circuit structure 10 where the trench 60 is formed at the periphery (but inside the die saw line area) of the die 20 and substantially filled in with the molding compound 100, according to one embodiment of the present disclosure. FIG. 5 illustrates the same integrated circuit structure but from a top down view where the molding compound 100 is formed in the trench 60. For the sake of illustration and clarity, the molding compound 100 is not shown formed above the die 20, underfill 25, or portions of wafer 22. FIG. 5 shows trench 60 as one continuous trench going around die 20, according to one embodiment. In some embodiments, however, trench 60 may be a discontinuous trench, in other words, trench 60 may comprise of one or more independent and separate trenches running substantially along the periphery of the die 20.

Figure 7:
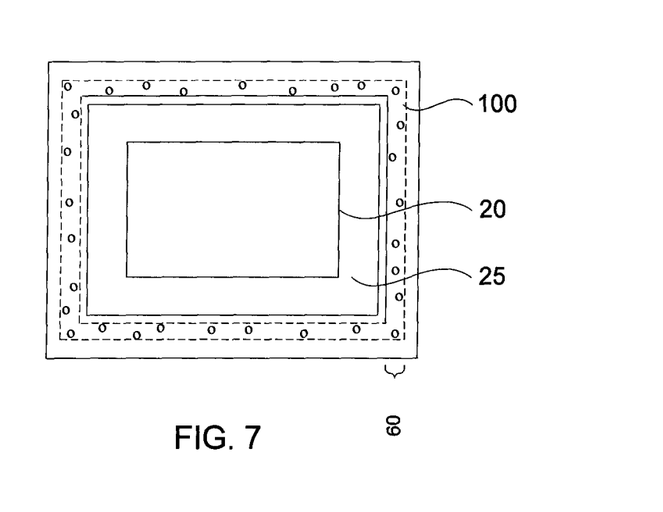
Figure 8:
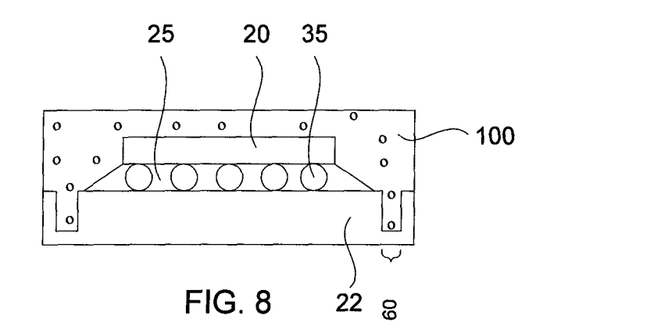

FIG. 8 shows a cross-sectional view of the integrated circuit structure 10 where the trench 60 is formed at the periphery of, but closer to die 20 and substantially filled in with the molding compound 100, according to one embodiment of the present disclosure. FIG. 7 shows a top down view of the IC structure where the molding compound 100 is shown formed in the trench 60. Again, for the sake of clarity, the molding compound 100 is not shown formed above the die 20, underfill 25, or portions of wafer 22 in FIG. 7. FIG. 7 shows trench 60 as one continuous trench formed at the periphery of die 20, according to one embodiment. In some embodiments, however, trench 60 may be a discontinuous trench, meaning that trench 60 may be comprised of several individual separate trenches running substantially along the periphery of the die 20. In some embodiments, the trench 60 is formed in the wafer 22 running substantially along one or more die saw lines of the wafer.

Figure 9:
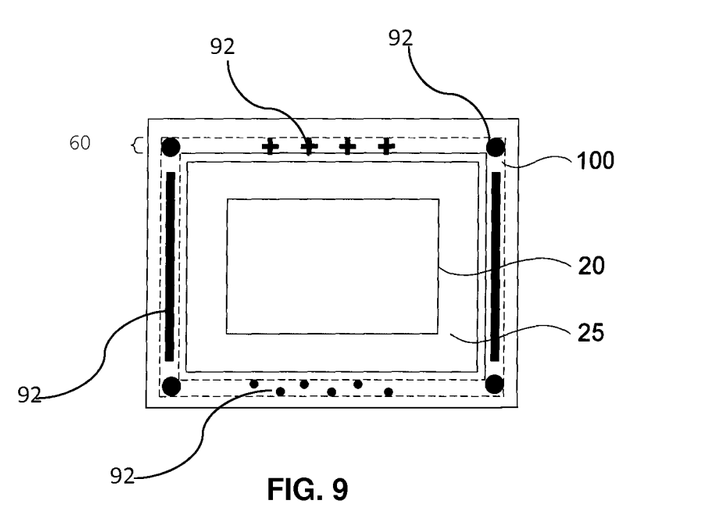
Figure 10:
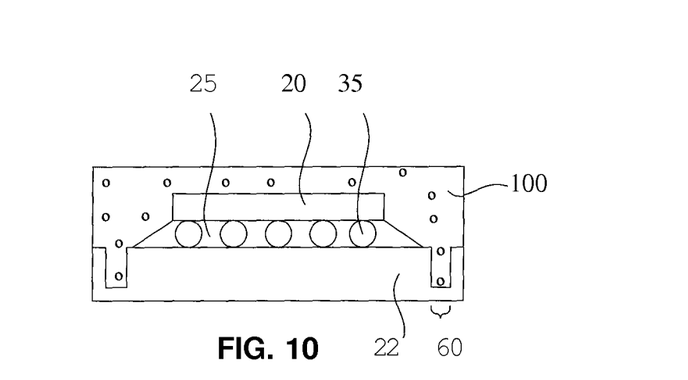

While the trench 60 shown in FIGS. 5 to 8 has the shape of a rectangle, it is to be understood that trench 60 may comprise any shape, according to design choices dependent on the fabrication process being employed. For example, trench 60 may have a circular, oval, triangular, square, pentagonal, hexagonal, heptagonal, octagonal, star, cross, or elliptical shape. FIGS. 10 and 9 show the trench comprising of a rectangular, circular (of various sizes), and cross shapes, according to one embodiment. FIG. 9 includes a plurality of trenches 92 of different shapes, according to one or more embodiments.

Figure 4:
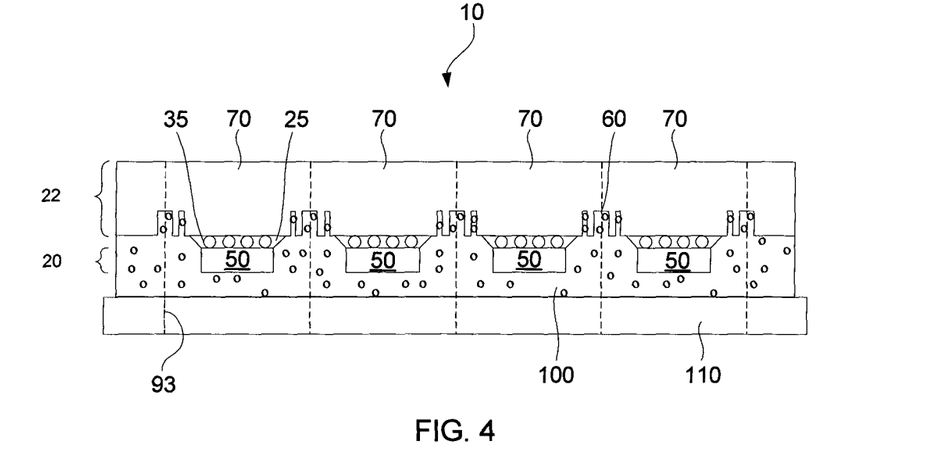

With reference now to FIG. 4, typically after wafer 22 has undergone a wafer-level test procedure, wafer 22 is then inverted and affixed to a dicing tape 110 or a die frame where it is then diced in the usual manner along cutting lines 93 to separate the encapsulated wafer into individual semiconductor packages for mounting onto a substrate, such as a printed circuit board (PCB).

Figure 11:
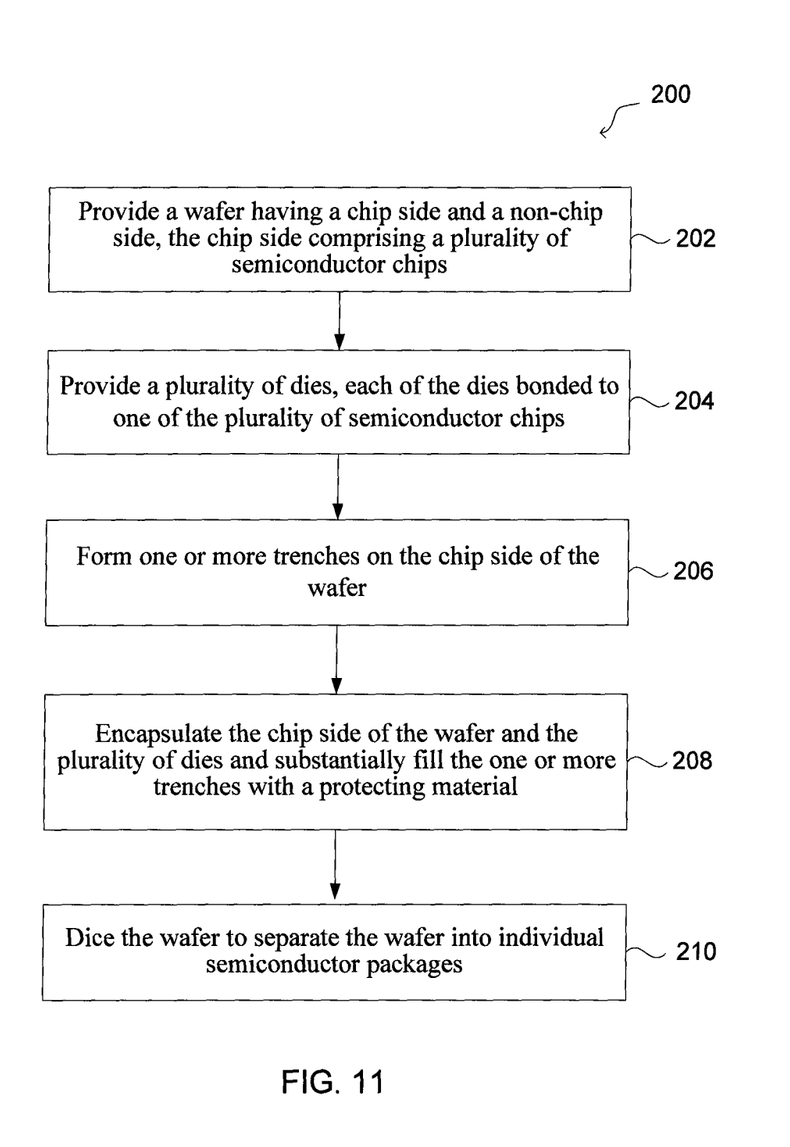
FIG. 11 is a flowchart showing one embodiment of a method for forming an integrated circuit structure.

FIG. 11 is a flowchart showing one embodiment of a method 200 for forming an integrated circuit structure. The method 200 begins at step 202 by providing a wafer having a chip side and a non-chip side, the chip side comprising a plurality of semiconductor chips. At step 204, a plurality of dies are provided, each of the dies is bonded to one of the plurality of semiconductor chips. At step 206, one or more trenches are formed on the chip side of the wafer. At step 208, the chip side of the wafer and the plurality of dies are encapsulated with a protecting material, the protecting material substantially filling in the one or more trenches. At step 210, the wafer is diced to separate it into individual semiconductor packages for mounting onto a substrate (e.g., PCB).

The methods of forming wafer level chip molded packages according to embodiments of the present disclosure may be employed in a wide range of package applications. By having the molding compound embedded in the underlying wafer, the adhesion between the molding compound and the wafer is enhanced. This prevents a possible delamination that could result from temperature cycle tests, for example where the coefficient of thermal expansion becomes an issue.

One aspect of this description relates to an integrated circuit structure. The integrated circuit structure includes a semiconductor chip having a die side and a non-die side, the die side having one or more trenches formed therein. The integrated circuit structure further includes at least one die bonded onto the die side of the semiconductor chip. The integrated circuit structure further includes a protecting material encapsulating the at least one die and substantially filling the one or more trenches.

Another aspect of this description relates to an integrated circuit structure including a wafer having a chip side and a non-chip side, the chip side comprising a plurality of semiconductor chips. The integrated circuit structure further includes a plurality of dies, each of die of the plurality of dies bonded to a corresponding semiconductor chip of the plurality of semiconductor chips. The integrated circuit structure further includes one or more trenches on the chip side of the wafer, wherein at least one trench of the one or more trenches has a plurality of cross-sectional shapes. The integrated circuit structure further includes a protecting material substantially filling each trench of the one or more trenches.

Still another aspect of this description relates to an integrated circuit structure including a wafer having a chip side and a non-chip side, the chip side comprising a semiconductor chip. The integrated circuit structure further includes a die bonded to the semiconductor chip. The integrated circuit structure further includes a trench on the chip side of the wafer, wherein the trench has a plurality of cross-sectional shapes. The integrated circuit structure further includes a protecting material substantially filling the trench.

In the preceding detailed description, the present disclosure is described with reference to specific exemplary embodiments thereof. It will, however, be evident that various modifications, structures, processes, and changes may be made thereto without departing from the broader spirit and scope of the present invention, as set forth in the claims. The specification and drawings are, accordingly, to be regarded as illustrative and not restrictive. It is understood that the present invention is capable of using various other combinations and environments and is capable of changes or modifications within the scope of the inventive concept as expressed herein.

What is claimed is:

1. An integrated circuit structure, comprising:
   a semiconductor chip having a die side and a non-die side, the die side having a first trench and a second trench formed therein, wherein a shape of the first trench is different from a shape of the second trench in a planar view;
   at least one die bonded onto the die side of the semiconductor chip, and at least one of the first trench or the second trench has a length greater than a length of the at least one die and less than a length of the semiconductor chip; and
   a protecting material encapsulating the at least one die and substantially filling the first trench and the second trench.

2. The integrated circuit structure of claim 1, wherein at least one of the first trench or the second trench is formed to a depth of between about 100 Angstroms to about 150,000 Angstroms.

3. The integrated circuit structure of claim 1, wherein at least one of the first trench or the second trench is formed in the semiconductor chip running along a periphery of the at least one die.

4. The integrated circuit structure of claim 3, wherein at least one of the first trench or the second trench is formed inside a scribe line region of the semiconductor chip.

5. The integrated circuit structure of claim 1, wherein at least one of the first trench or the second trench comprises a circular, oval, rectangular, triangular, square, pentagonal, hexagonal, heptagonal, octagonal, star, cross, or elliptical shape.

6. An integrated circuit structure comprising:
   a substrate having a chip side and a non-chip side, the chip side comprising a semiconductor chip;
   a die bonded to the semiconductor chip;
   a plurality of trenches on the chip side of the substrate, wherein at least one trench of the plurality of trenches has a different shape from at least another trench of the plurality of trenches in a planar view, the at least one trench of the plurality of trenches has a substantially rectangular shape, and the at least another trench of the plurality of trenches has a shape selected from the group consisting of circular, oval, triangular, pentagonal, hexagonal, heptagonal, octagonal, star, and elliptical, and the plurality of trenches located in a peripheral region of the semiconductor chip; and
   a protecting material substantially filling each trench of the plurality of trenches.

7. The integrated circuit structure of claim 6, wherein a bond between the die and the semiconductor chip comprises an oxide-oxide bond, an oxide-silicon bond, a copper-copper bond, or an adhesive bond.

8. The integrated circuit structure of claim 6, further comprising an underfill material between the substrate and the die.

9. The integrated circuit structure of claim 8, wherein the protecting material surrounds the underfill material.

10. The integrated circuit structure of claim 6, wherein the protecting material encapsulates the die.

11. The integrated circuit structure of claim 6, wherein each trench of the plurality of trenches is discontinuous.

12. An integrated circuit structure comprising:
    a substrate having a chip side and a non-chip side, the chip side comprising a semiconductor chip;
    a die bonded to the semiconductor chip;
    a plurality of trenches on the chip side of the substrate, wherein the plurality of trenches includes at least three different shapes in a planar view, and the at least three different shapes are selected from the group consisting of circular, oval, rectangular, triangular, square, pentagonal, hexagonal, heptagonal, octagonal, star, cross, and elliptical; and
    a protecting material substantially filling the plurality of trenches.

13. The integrated circuit structure of claim 12, wherein an edge of at least one trench of the plurality of trenches is aligned with an edge of the substrate.

14. The integrated circuit structure of claim 12, wherein the substrate comprises a peripheral substrate portion, and the peripheral substrate portion surrounds at least one trench of the plurality of trenches.

15. The integrated circuit structure of claim 12, further comprising an underfill material between the semiconductor chip and the die.

16. The integrated circuit structure of claim 15, wherein the protecting material surrounds the underfill material.

17. The integrated circuit structure of claim 12, wherein the protecting material encapsulates the die.

18. The integrated circuit structure of claim 12, wherein each trench of the plurality of trenches is discontinuous.

19. The integrated circuit structure of claim 12, wherein at least one trench of the plurality of trenches is around a periphery of a bonding location between the die and the semiconductor chip.

20. The integrate circuit structure of claim 12, wherein the plurality of trenches comprises a first trench of the plurality of trenches around a second trench of the plurality of trenches separated from the first trench.

\* \* \* \* \*